United States Patent
Delker et al.

[11] Patent Number: 6,114,908
[45] Date of Patent: Sep. 5, 2000

[54] BIPOLAR IMPEDANCE CONVERTER CIRCUIT

[75] Inventors: Klaus Delker; Wilhelm Wilhelm, both of München, Germany

[73] Assignee: Siemens Aktiengesellschaft, Munich, Germany

[21] Appl. No.: 09/164,122

[22] Filed: Sep. 30, 1998

[30] Foreign Application Priority Data

Sep. 30, 1997 [DE] Germany .................. 197 43 205

[51] Int. Cl.[7] .................................................. H03F 3/45
[52] U.S. Cl. ................................. 330/257; 330/260
[58] Field of Search ........................... 330/252, 257, 330/260, 292

[56] References Cited

U.S. PATENT DOCUMENTS 5,045,807  9/1991  Ishihara et al. .................. 330/260
5,260,672  11/1993 Vorel ................................ 330/257
5,345,073  9/1994  Chang et al. .................... 330/260 X

FOREIGN PATENT DOCUMENTS 0161067  11/1985  European Pat. Off. .
4018277   10/1994  Germany .

OTHER PUBLICATIONS

Japanese Patent Abstract No. 58–159006 (Nakagawa), dated Sep. 21, 1983.

*Primary Examiner*—Steven J. Mottola
*Attorney, Agent, or Firm*—Herbert L. Lerner; Laurence A. Greenberg; Werner H. Stemer

[57] ABSTRACT

The present invention describes a bipolar impedance converter circuit, which comprises a differential amplifier that has a closed-loop control circuit in its negative feedback loop. This closed-loop control circuit comprises npn transistors, which because of their relatively low stray capacitances and their fast switching speed provide an impedance converter circuit with greater invulnerability to disturbances in the supply voltage and have faster switching behavior than known circuits in the prior art, which use pnp transistors in their negative feedback loop.

3 Claims, 1 Drawing Sheet

BIPOLAR IMPEDANCE CONVERTER CIRCUIT

BACKGROUND OF THE INVENTION

FIELD OF THE INVENTION

The present invention relates to a bipolar impedance converter circuit. Impedance converters are active quadrupoles with a voltage amplification of one, which are distinguished by input impedance and low output impedance. The basic function of an impedance converter is to copy a signal, via a high-impedance input, to an output having a lower internal resistance.

Typically, these converters are embodied by an operational amplifier with direct negative feedback. These impedance converters known from the prior art comprise a differential amplifier which has the highest possible gain. To attain this high gain even with low collector currents of the transistors that form the differential amplifier, a so-called active load is used in the negative feedback loop. This load comprises transistors. In the impedance converters known from the prior art, pnp transistors are used for this.

A disadvantage of these known circuits is that integrated pnp transistors, at low collector currents and high gain, require a relatively large surface area and thus have a large undesired (parasitic collector-to-substrate capacitance. It is important in impedance converters that the influence of changes in the supply voltage, whether these are changes in direct voltage or disturbances in alternating voltage, remain as slight as possible. This is not assured, however, by using pnp transistors in the known impedance converter circuits, because of the high parasitic capacitances of pnp transistors. In addition, pnp transistors are relatively slow, which causes a marked delay in the signal to be converted.

SUMMARY OF THE INVENTION

It is therefore the object of the present invention to create an impedance converter circuit, which overcomes the above-mentioned disadvantages of the heretofore-known devices and methods of this general type and which is largely invulnerable to fluctuations in the supply voltage, and in which the output voltage follows the input voltage faster than in the prior art circuits.

With the foregoing and other objects in view there is provided, in accordance with the invention, a bipolar impedance converter circuit, comprising:

an operational amplifier with direct negative feedback, the operational amplifier including two differential amplifier transistors forming a differential amplifier, the transistors having collectors carrying collector currents;

a closed-loop control circuit comprising a plurality of npn transistors connected in the negative feedback loop so as to maintain the collector currents in the differential amplifier transistors constant in the event of changes in a supply voltage.

In accordance with an added feature of the invention, the closed-loop control circuit includes a current mirror circuit comprising two npn transistors.

In accordance with a concomitant feature of the invention, the differential amplifier transistors are two npn transistors having emitters connected jointly to a current source formed by a further npn transistor, and wherein the collectors are connected, each via series-connected transistors, mutually separated by one resistor, to a negative supply voltage.

In other words, the objects of the invention are satisfied in that npn transistors are used in the negative feedback loop, instead of the previously used pnp transistors. For the same power, the npn transistors have very much smaller surfaces and thus very much lower parasitic capacitances than comparable pnp transistors. Furthermore, npn transistors are faster than comparable pnp transistors.

Other features which are considered as characteristic for the invention are set forth in the appended claims.

Although the invention is illustrated and described herein as embodied in a bipolar impedance converter circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENT

Figure 1:
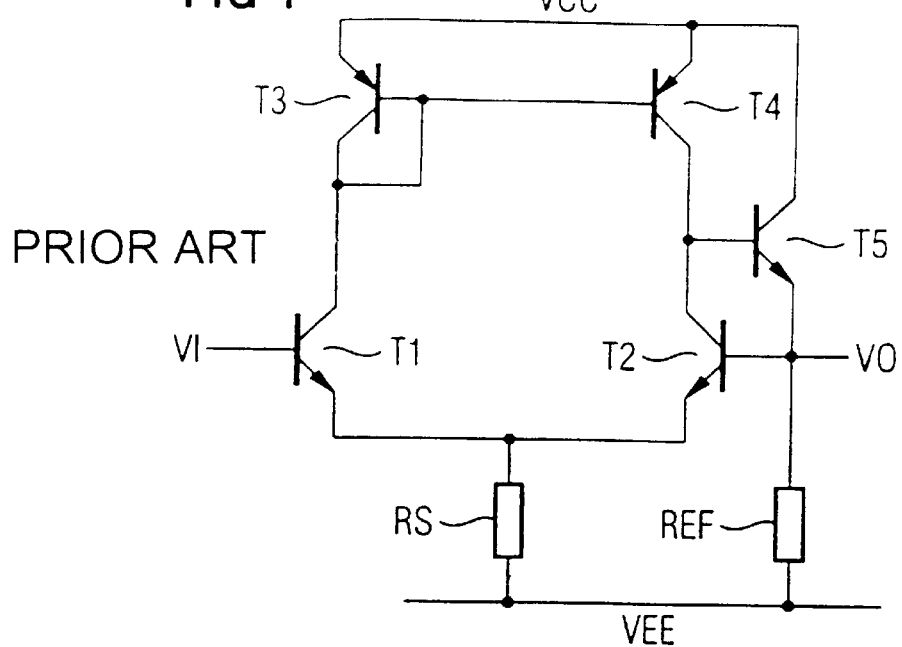
FIG. 1 is a circuit schematic of a prior art impedance converter circuit.

Referring now to the figures of the drawing in detail and first, particularly, to FIG. 1 thereof, there is seen an impedance converter circuit as in the prior art. It comprises the two transistors T1 and T2, which form a differential amplifier. In its negative feedback loop, the differential amplifier has an active load, comprising the pnp transistors T3 and T4. The input voltage of the impedance converter is applied to the transistor T1 and is designed VI. The output voltage of the impedance converter is picked up at the transistor T5 and is designated as VO. The circuit is supplied with the supply voltage VCC. Since as already noted above the pnp transistors used in the negative feedback loop have a high parasitic collector-to-substrate capacitance, disturbances in the positive supply voltage VCC re carried on via the base of the transistor T5 directly to its low-impedance emitter, and thus lead to poorer suppression of these disturbances in the supply voltage at the output.

Figure 2:
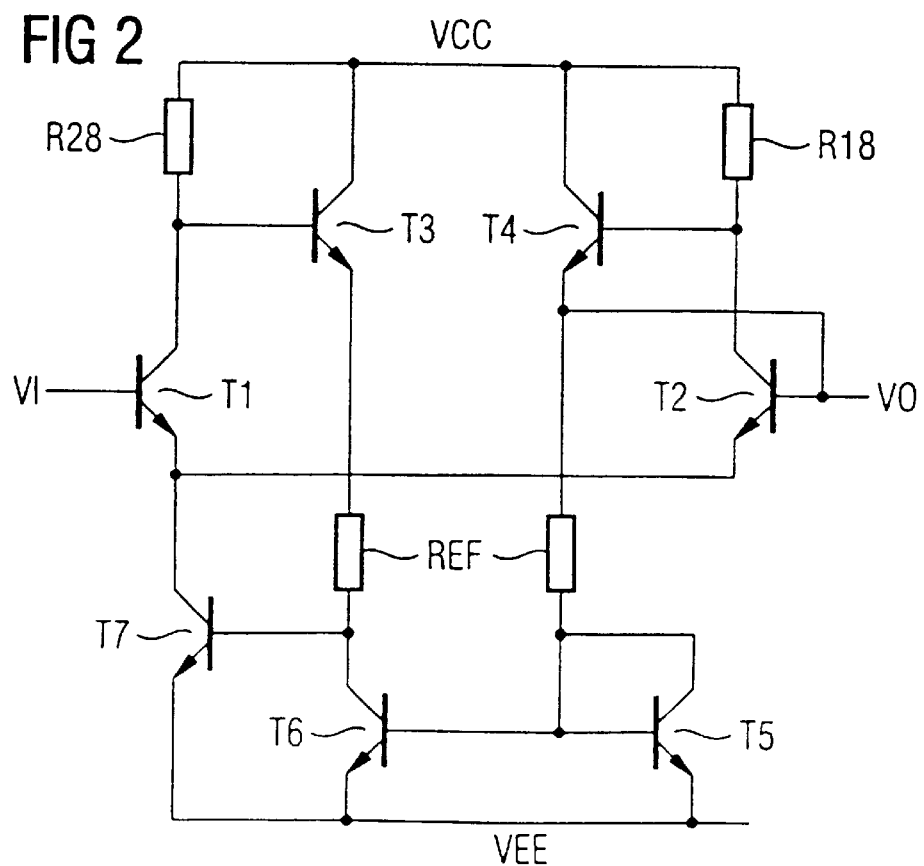
FIG. 2 is a circuit schematic of an impedance converter circuit according to the invention.

FIG. 2 shows the impedance converter circuit of the present invention. Once again, it comprises two transistors T1 and T2, which form a differential amplifier. This differential amplifier, in its negative feedback loop, has a closed-loop control circuit which is formed by transistors T3, T4, T5, T6. As can be seen, the circuit of the invention dispenses with pnp transistors entirely, and even in the negative feedback loop uses only npn transistors.

In order for the output voltage VO to follow the input voltage VI precisely, care must be taken to assure that the collector currents in the transistors T1 and T2 of the differential amplifier are equal. In that case, the voltages between the base and the emitter (UBE) of both transistors T1 and T2 are also equal. Since the resistances in the two collector circuits are of the same magnitude, it is sufficient if the collectors of the two transistors T1 and T2 are kept at the same potential. This is accomplished according to the invention by the closed-loop control circuit comprising the transistors T1, T3 and T7.

It will now be disclosed in further detail how the circuit according to the invention and as shown in FIG. 2 functions. To this end it should be noted that the differential amplifier comprising the transistors T1 and T2 is intended to function in equilibrium within the linear portion of its transmission characteristic curve. In that case, the transistors T1 and T2 each carry half the current source current at the operating point.

The current mirror circuit, which comprises the transistors T5 and T6 and which has resistors REF of equal size in its branches, assures that identical currents flow and identical voltage drops occur in both branches.

The mode of operation of the circuit will now be described, taking as an example a readjustment in the case of a supply voltage VCC that is becoming more positive. The negative supply voltage is set to 0 V. The supply voltage VCC accordingly rises in the positive direction. In order for the output voltage VO to remain equal to the input voltage VI independently of the supply voltage, care must be taken to assure that the base potential of the transistor T4 remain approximately constant. To that end, the voltage across the resistor R18 must increase in accordance with the increase in the supply voltage VCC. To that end, the current through the resistor R18 must rise. This can be effected by means of suitable triggering of the transistor T2. Since the sum of the currents through the resistor R18 and the corresponding resistor R28 in the collector branch of the transistor T1 is the current through the transistor T7, and that current is initially constant, the current through the resistor R28 must become correspondingly less if the current through the resistor R18 rises. This interferes with the equilibrium of the transistors T1 and T2, and they then carry currents of different magnitude. This would cause the output voltage VO to rise. However, since the current through the resistor R28 becomes less, the voltage drop across the resistor R28 also becomes less, and as a result the base potential of the transistor T3 rises. The potential at the base of the transistor T7, which acts as the current course transistor of the differential amplifier, increases as well. The increasing base potential of the transistor T7 leads to an increase in the current through the transistor T7. As a consequence, the current through the resistor R28 rises again as well, until it has reached the value of the current through the resistor R18. The transistors T1 and T2 thus once again have the same collector potentials, and the circuit is again in equilibrium.

The change in the supply voltage to a more-positive value has accordingly been cancelled out by the circuit of the invention in such a way that the circuit returns to its state of equilibrium, and thus the output voltage is again equivalent to the input voltage, as was the case before the change occurred in the supply voltage.

It has been possible to determine by simulation tests that in the circuit of the invention (FIG. 2), compared to the circuit of the prior art (FIG. 1), when comparable components are used a disturbance in the output voltage VO, in the event of disturbances in the supply voltage VCC, that is approximately 35 db less has occurred. It has also been possible to observe in the circuit of the invention, that by the use of the faster-switching npn transistors, the output voltage VO follows the input voltage VI much faster. As a consequence of the pnp technology employed, it has been possible to improve the edge steepness of the circuit according to the invention by up to four times, compared with circuits of the prior art.

Overall, the impedance converter circuit of the invention is thus a circuit which is far less vulnerable to disturbances in the supply voltage and that also furnishes a faster pulse response than the impedance converter circuits of the prior art known before now.

We claim:

1. A bipolar impedance converter circuit, comprising:
    an operational amplifier with direct negative feedback, said operational amplifier including two differential amplifier transistors forming a differential amplifier, said transistors having collectors carrying collector currents; and
    a closed-loop control circuit having a plurality of npn transistors connected in the negative feedback loop so as to maintain the collector currents in the differential amplifier transistors constant in the event of changes in a supply voltage and a current mirror circuit having two transistors.

2. The bipolar impedance converter circuit according to claim 1, wherein said two transistors of said current mirror circuit are two npn transistors.

3. The bipolar impedance converter circuit according to claim 2, wherein said differential amplifier transistors are two npn transistors having emitters connected jointly to a current source formed by a further npn transistor, and wherein said collectors are connected, each via series-connected transistors, mutually separated by one resistor, to a negative supply voltage.

* * * * *